Figure 1:
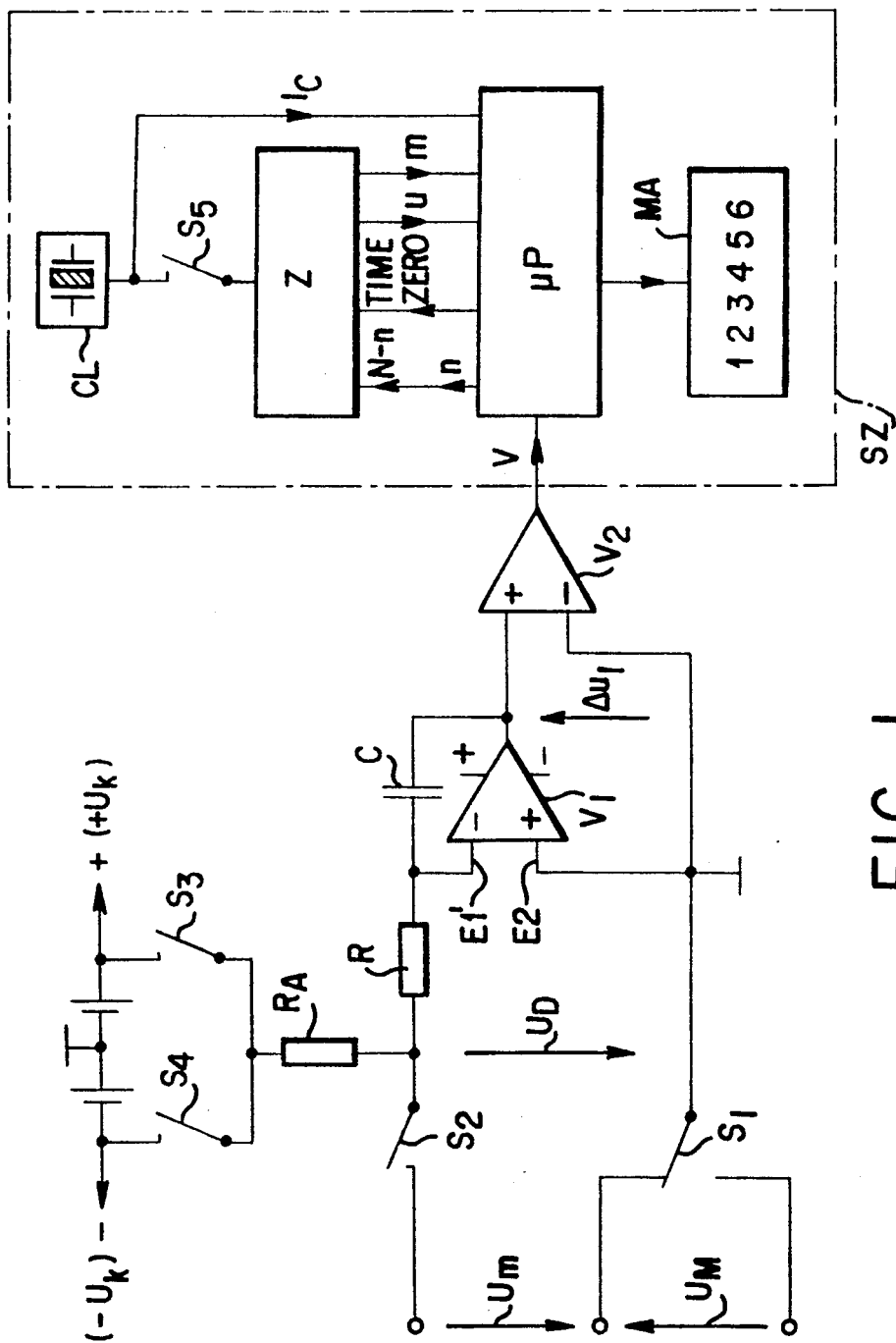

United States Patent [19]

Horn

[11] Patent Number: 5,014,058
[45] Date of Patent: May 7, 1991

[54] METHOD AND ARRANGEMENT FOR EVALUATING A MEASURABLE ANALOG ELECTRICAL QUANTITY

[75] Inventor: Klaus Horn, Braunschweig, Fed. Rep. of Germany

[73] Assignee: Siemens Aktiengesellschaft, Berlin & Munich, Fed. Rep. of Germany

[21] Appl. No.: 425,212

[22] PCT Filed: Mar. 31, 1988

[86] PCT No.: PCT/DE88/00210

§ 371 Date: Dec. 1, 1989

§ 102(e) Date: Dec. 1, 1989

[87] PCT Pub. No.: WO88/07658

PCT Pub. Date: Oct. 6, 1988

[51] Int. Cl.⁵ .............................................. H03M 1/50
[52] U.S. Cl. ..................................... 341/166; 341/167
[58] Field of Search .............................. 341/166, 167

[56] References Cited

U.S. PATENT DOCUMENTS

| 4,024,533 | 5/1977 | Neumann | 341/167 |
| 4,608,553 | 8/1986 | Ormand | 341/167 |
| 4,694,277 | 9/1987 | Takahashi | 341/167 |
| 4,739,305 | 4/1988 | Naito | 341/167 |

FOREIGN PATENT DOCUMENTS 3330841 3/1985 Fed. Rep. of Germany ...... 341/166

OTHER PUBLICATIONS

"Halbleiterschaltungstechnik", Tietze et al., 5th Edition, Springer-Verlag, pp. 663–664 (1980).
"Uber die Genauigkeit elektrischer Grundnormale und Kompensationsmesseinrichtungen", Angersbach, Archiv fur Technisches Messen (ATM), J930-3 (1964).

Primary Examiner—A. D. Pellinen
Assistant Examiner—Marc S. Hoff
Attorney, Agent, or Firm—Kenyon & Kenyon

[57] ABSTRACT

A process and arrangement for evaluating a measurable analog electronic quantity based on the principle of the timekeeping mechanism, in which the measurable analog quantity is digitalized by counting integration processes. To exploit the simplicity and precision of the timekeeping mechanism principle also far fast and precise digital data conversion units, a deviation coding phase (AV) is inserted between the timekeeping mechanism periods (T), in which post-adjustment of the timekeeping mechanism timing ratio is possible with rapid digital circuits even in the event of abrupt fluctuations of the quantity to be measured. The invention is generally applicable for highly precise and rapid digital data conversion of analog quantities, and is especially advantageous in high-precision measuring instruments with measuring sensors in bridge circuits, for example in weighing cells based on the DMS principle in electronic balances.

13 Claims, 8 Drawing Sheets

METHOD AND ARRANGEMENT FOR EVALUATING A MEASURABLE ANALOG ELECTRICAL QUANTITY

The invention relates to a method and an arrangement for evaluating an analog measurement quantity according to the time divider principle.

In measurement value-processing systems which use the time divider principle, evaluating methods are applied in which, in a fixed integration interval, values equivalent to the measurement quantities are determined, for instance, by counting out clock pulses of constant frequency; thus, a corresponding analog-digital conversion is carried out. The time divider principle contains two integration parts, of which the first part represents a compensation of the measurement quantities by an unbalancing quantity of opposite polarity (up-integration) and the second integration part contains a down-integration. So that at the end of the two integration parts, i.e., at the end of the time divider period, the integration signal has become zero, the time of the first integration part must be adjusted accordingly relative to the total time divider period. Thus, the measurement result can be taken directly from this time divider clock ratio.

In a known method operating according to the time divider principle of this type (German Pat. No. 33 30 841) it was possible to achieve high resolution and conversion accuracy with a relatively small cost for components. The integration circuit for the analog-digital conversion used, however, has several disadvantages; there, the time divider ratio, i.e., the correct adjustment of the time of the first integration part relative to the total time divider period is obtained by an evaluation extending over a multiplicity of time divider periods, of the amplified control deviation signal as well as over its phase-selective rectification and subsequent smoothing by an analog lowpass filter included in a servo control circuit of the time divider adjustment. Thereby, the known method has a rather sluggish response behavior to abrupt changes of the measuring quantity. Here, depending on the resolution, dead times and/or adjustment times $t_e$ of approximately 100 ms $<t_e<$ 1s are typical which, in a multiplicity of applications made the practical use of time divider circuits to date at least problematic if not impossible.

It is an object of the invention to provide a method and arrangement which makes possible, while retaining the low cost and the high accuracy and long-term stability of the time divider principle, a considerable improvement of the response behavior of the digital measurement values after abrupt changes of the measurement quantity as well as regarding its evaluation and further processing.

The method according to the invention is advantageously realized in such a manner that in a first step the control deviation $\Delta_1\alpha$ from the correct time divider ratio is determined by definite integration over the measurement and reference signal, for instance, by a Miller integrator, always exactly over a full time divider period T. An analog integration signal $\Delta U_i$ obtained thereby serves as a measure for the control deviation which is converted after the end of the time divider period into a digital control deviation signal $m_1$.

According to the invention, the digital control deviation signal is used for the correction of the time divider clock ratio $$\alpha_2 = \frac{n_2}{N} = \frac{n_1 - m_1}{N}$$

in the subsequent second time divider period.

According to another advantageous subidea of the invention, the overall circuit costs can be kept particularly low if the integrator used, for instance, the Miller integrator is utilized twice in the manner of a dual-slope method by up-integrating alternatingly in a first step, first via the time divider $T_1$, the sum of the measurement signal (input voltage $U_m$) and reference signal (standard voltage $U_n$) and subsequently, the deviation signal obtained thereby is digitized by a counting-down integration. The dual-slope method known per se for fast analog-digital conversion is described, for instance, in the book Tietze/Schenk "Halbleiterschaltungtechnik", Fifth Edition, 1980, Springer Verlag, pages 663 and 664.

Furthermore, this down-integration can take place for reasons of speed and costs advantageously in cascades. Such cascading is known per se from Angersbach, F. "On the Accuracy of Electrical Basic Standards and Compensation Measuring Devices", ATM (1964) J930-3.

An advantageous solution of the stated problem is also provided by an arrangement for carrying out the method of the type mentioned above. An arrangement with an integrating null amplifier, to the inputs of which the reference quantity and/or the measurement quantity are applied via switches, controlled as to the time divider ratio, is known from the already mentioned German Pat. No. 33 30 841. According to the invention, the realization of the deviation encoding period with an evaluation of the control deviation signal is made possible in an advantageous manner by the described design of the control units.

According to a further embodiment of the invention, a microcomputer is advantageously used for controlling the time divider periods $T_{65}$, its clock ratio $\alpha_\gamma = n_\gamma/N$ as well as the switching of the integration amplifier to which is also assigned the task of suppressing dynamic interference components and in the measuring signals, by digital filtering of the measurement value $n_\gamma + m_\gamma = n_{\gamma+1}$. Since this digital filtering, in the arrangement according to the invention, is no longer located in the control circuit of the time divider arrangement, it can operate in accordance with any practical filter algorithm, without having to tolerate stabilization problems in the servo control circuit.

According to a further embodiment, the pole alternation for suppressing interference due to thermo and contact voltages in the measuring circuit described in German Pat. No. 33 30 841 is used advantageously also for stringent accuracy requirements, also in case of null drifts and noise components of the integrating null amplifier if the microprocessor weighs the furnished digital signals according to the alternating pole direction with synchronously alternating sign. From the sequence of the measurement values then obtained with alternating sign, the magnitude and sign of d-c voltage drift then obtained can be recognized and taken into consideration when computing the time divider adjustment value. Above all, an analog compensation of the null drift can be added for stringent accuracy requirements so that the null amplifier is protected from overloads and is always operated at its symmetrical operating point.

A particularly advantageous application of the method according to the invention and of the arrangement of the invention is obtained if the invention is used in high-precision electromechanical scales to ensure fast indication of the measured value also if the load changes rapidly.

The invention will be explained, referring to the figures, where

Figure 2:
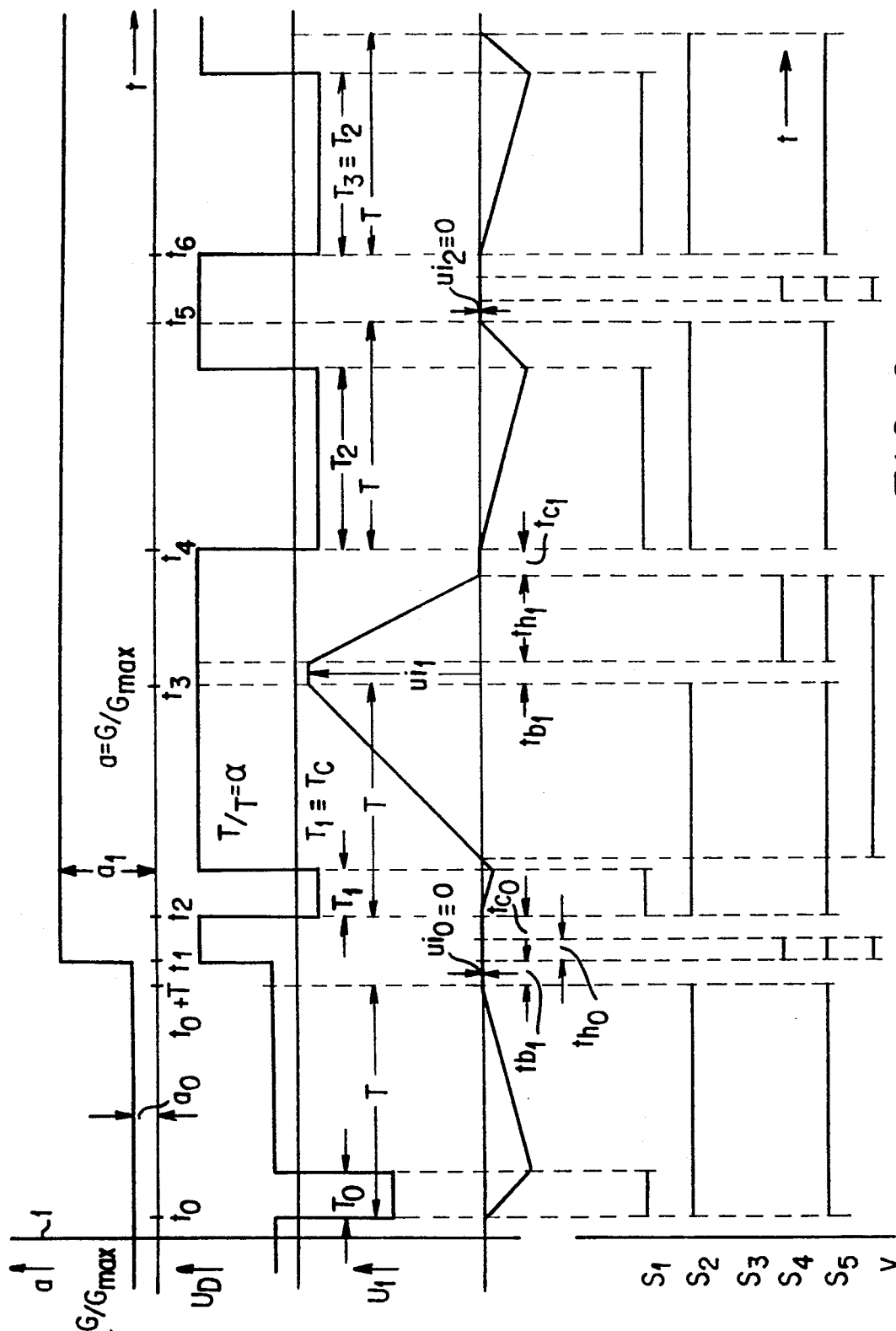
Figure 3:
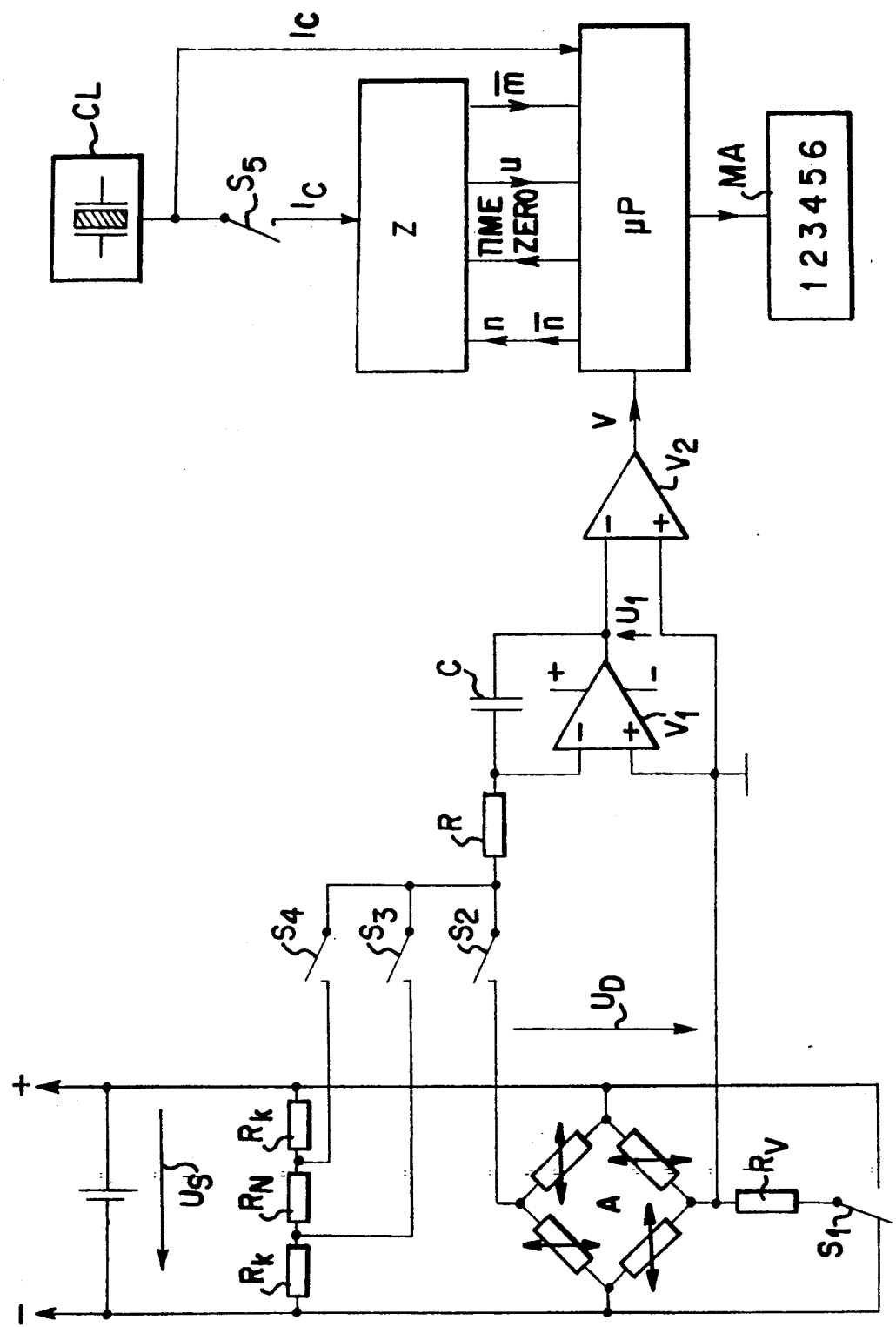
Figure 4:
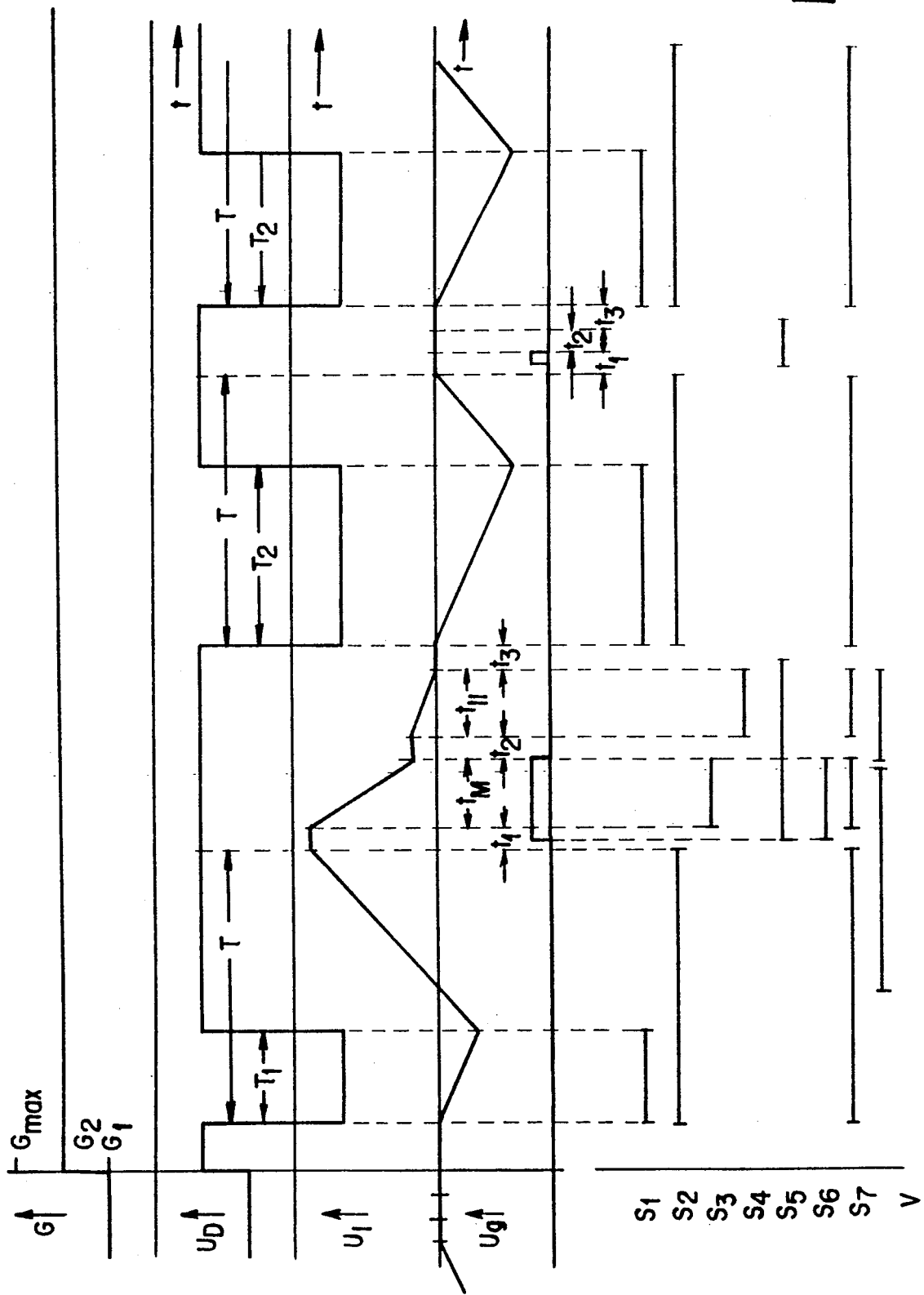
Figure 5:
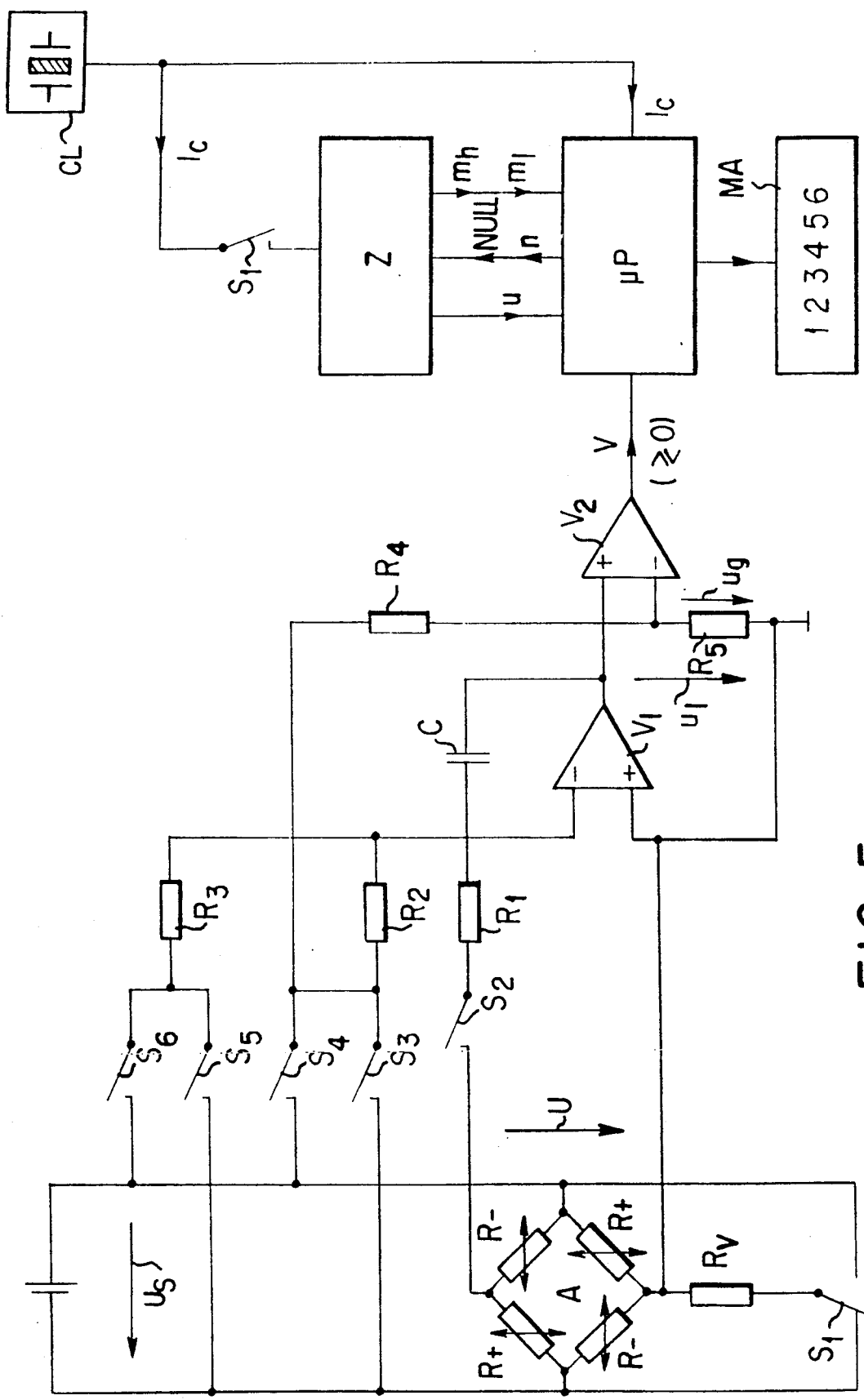
Figure 6:
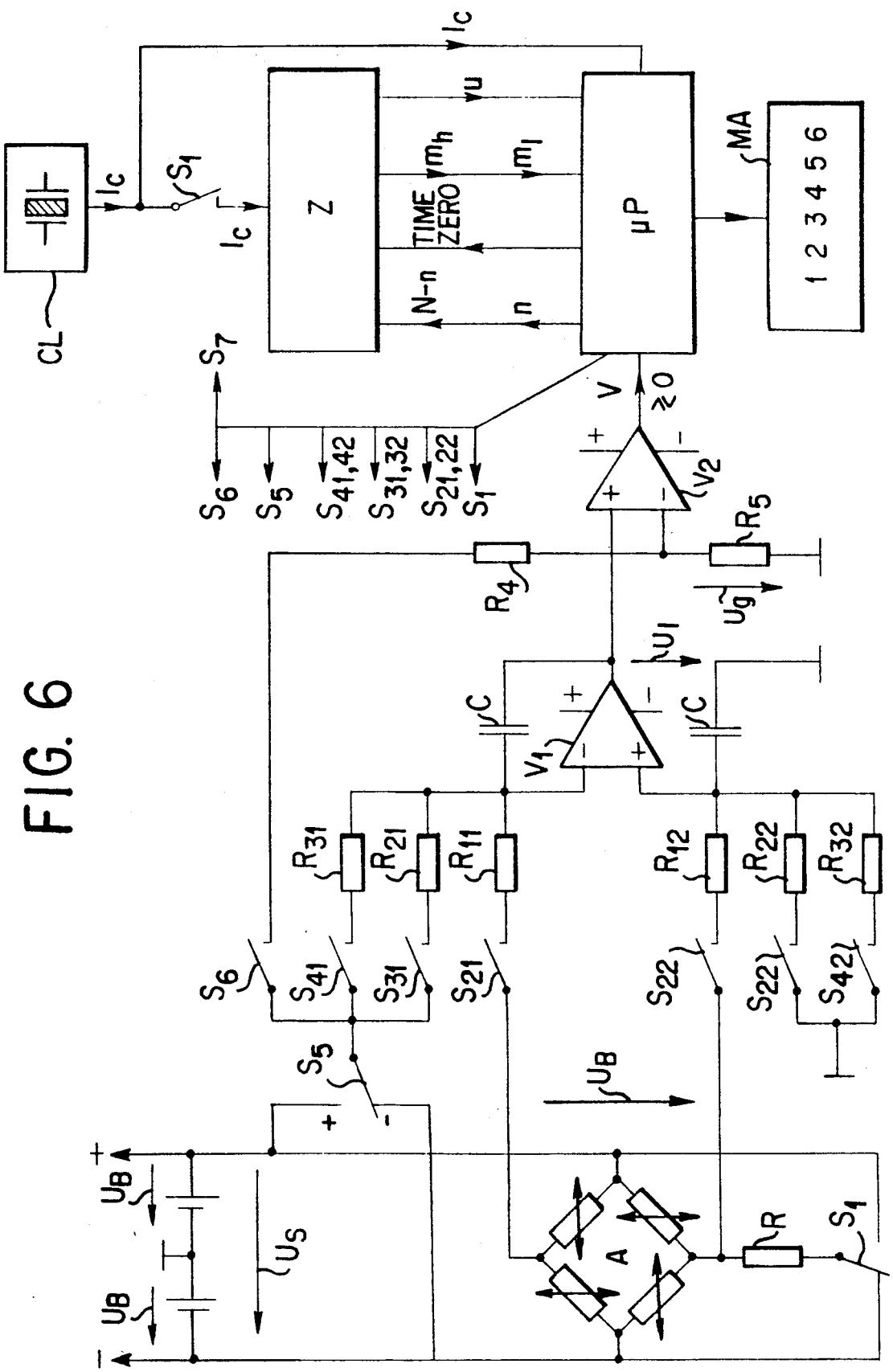
Figure 7:
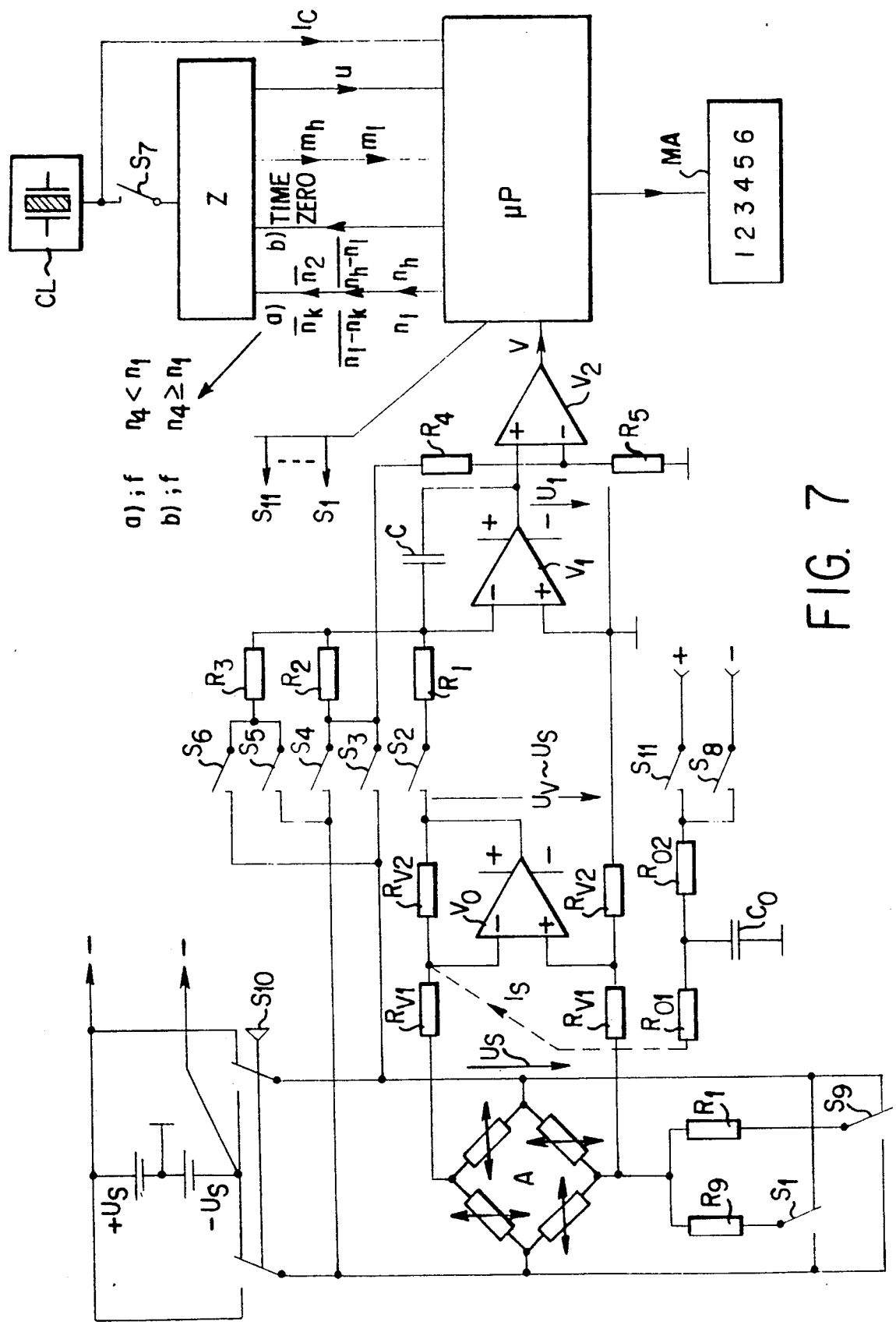
Figure 8:
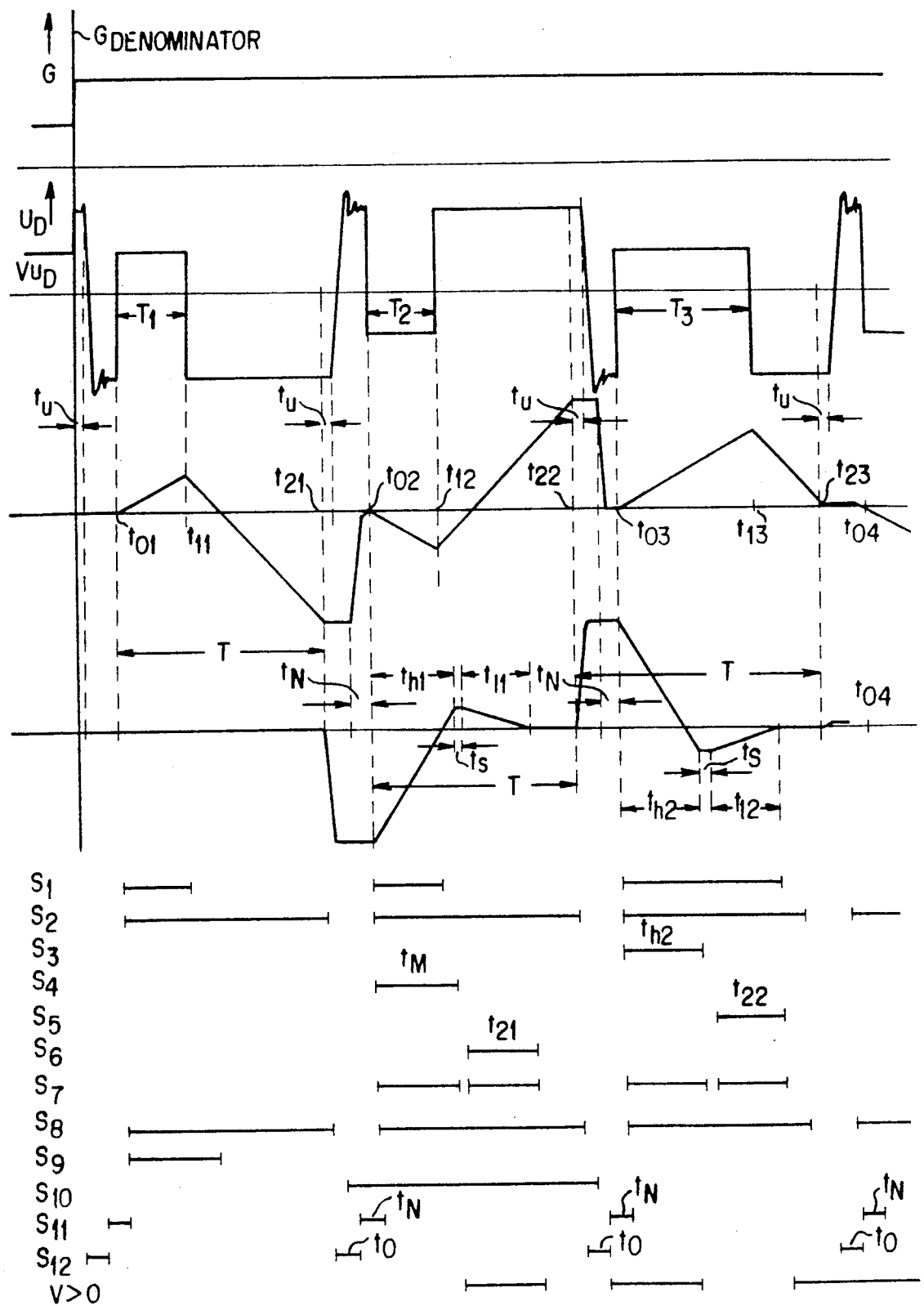

FIG. 1 shows a first embodiment of the invention, from which the basic operation of a measuring method with the time divider can be seen, FIG. 2, the signal and switch diagrams required for an understanding of the embodiment, FIG. 3, an expanded embodiment with a measuring pickup in a bridge circuit, FIG. 4, the signal and switch diagrams required for an understanding of the expanded embodiment, FIG. 5, a third embodiment with a dual-slope analog-digital and cascading the down-integration process, FIG. 6, a variant of the embodiment according to FIG. 5, with operation symmetrical to ground of the measurement value pickup, FIG. 7, a fourth embodiment with pole switching of the d-c current and voltage supply of the measuring quantity pickup and FIG. 8, a signal and switch diagram necessary for an understanding of the fourth embodiment.

In the circuit shown in FIG. 1, an input voltage $U_m$ is present as an analog electrical measurement quantity and a standard voltage $U_N$ as a comparison or reference quantity which are brought via a switch $S_2$ and a resistor R to a first input $E_1$ of a first operational amplifier $V_1$ and via a double-throw switch $S_1$ to a second input $E_2$ of the operational amplifier $V_1$. The second input $E_2$ is at ground potential. The operational amplifier $V_1$ represents with the resistor R and a capacitor C a Miller integrator for the definite integration of a voltage $U_D$ which is formed from the input voltage $U_m$ and/or the normal voltage $U_N$. At the output of the operational amplifier $V_1$ is applied a voltage $\Delta U_i$, which in the case that the time divider ratio $\alpha$ is set correctly at the end of the integration of $U_D$ extending over a full time divider period T is zero but in the presence of a faulty time divider ratio $\alpha$ has a value which as to sign and magnitude is proportional to the deviation $\alpha$ of the time divider clock ratio $\Delta\alpha$ from its correct value $$\alpha_{correct} = \frac{U_M}{U_N} = \frac{\tau_{correct}}{T} \quad (1)$$

At a circuit point between the switch $S_2$ and the resistor R, either a positive compensation voltage $+U_k$ can be applied via a switch $S_3$ or via a switch $S_4$ a negative compensation voltage $-U_k$ which acts amplified on the first input $E_1$ of the operational amplifier $V_1$. The resistor $R_A$ can then be omitted (i.e., $R_A\equiv 0$) if $U_k$ is designed so that the equation $|U_k|=U_N$ is fulfilled.

The voltage $\Delta U_i$ at the output of the operational amplifier $V_1$ is brought to one input of a second operational amplifier $V_2$ connected as a comparator. The comparator output quantity V is present as a binary quantity at the input of a control and counting circuit SZ and gives information regarding the sign of $\Delta U_i$. This control and counting circuit SZ has as an essential component a microprocessor $\mu P$ which is supplied with clock pulses $I_c$ by a clock generator CL. There is further provided a settable down-counter Z according to the method described in detail in German Pat. No. 33 30 841, which can be supplied on the one hand via a switch $S_5$ with the clock pulses of the clock generator CL and further is given setting information n by the microprocessor $\mu P$. If the counter is counted down to the content zero by the clock pulses $T_c$ of the clock generator CL, it furnishes a control pulse (time zero) to the microprocessor $\mu P$. The microprocessor $\mu P$ also furnishes control pulses for the switches $S_1 \ldots S_4$ via control lines, not shown in detail here. The display of a numerical value equivalent to the measurement quantity is carried out by means of a display unit MA. The microprocessor, in the process, sets the counter Z to a value $n=\alpha \cdot N$ at the beginning of a definite integration period. After counting n clock pulses with the clock period $T_c$, exactly the time $\tau=n\cdot T_c$ has passed when the counter delivers a first null pulse. The latter disconnects the reference quantity ($U_N$) and simultaneously sets the counter to the value $\bar{n}=N-n$. When the counter has been counted down again to zero, the new zero pulse terminates the definite integration over a full time divider period $T=N\cdot T_c$ at which the time divider clock ratio $$\alpha = \frac{\tau}{T} = \frac{n\cdot T_c}{N\cdot T_c} = \frac{n}{N} \quad (2)$$

was switched.

The circuit of FIG. 1 will be explained, making reference to the diagrams for FIG. 2. The topmost diagram represents the modulation factor $a=G/G_{max}$ over the time t which, up to the time $t_1$ has the value $a_0$ and from the time $t_1$ on, the value $a_1$. Below, the waveform of the voltage $U_D$ at the input of the operational amplifier $V_1$ is given, from which the time divider clock ratio $\alpha_o = \tau_0/T = \alpha_o$ can be seen. As the third voltage diagram, the waveform of the voltage $U_i$ is shown, from which the integration processes, brought on by the time divider pulses or by the switching processes in the deviation encoding phases AV can be seen. Below are further shown the switching states of the switches $S_1$, $S_2$, $S_3$, $S_4$, $S_5$ as well as the waveform of the comparator output quantity V at the input of the control and counting circuit SZ versus time.

The circuit according to FIG. 1 works, first of all according to the voltage compensation principle, in that the input voltage $U_m$ is compensated by a part $\alpha \cdot U_N$ of the standard voltage $U_N$ which, as the arithmetic means, is derived down from $U_N$ according to the time divider principle by operating the double-throw switch $S_1$ in the ratio $$\alpha_v = \frac{\tau_v}{T} = \frac{n_v}{N} \quad (3)$$

The balance condition $\bar{U}_D = U_m - \alpha \cdot U_N$ is monitored here, according to the invention, intermittently always exactly over a full time divider period as a definite integral $$\bar{U}_D = \frac{1}{T} \int_{t_{E\gamma}}^{t_{E\gamma}+1} U_D dt = \frac{1}{T} \cdot \quad (4)$$

$$\left[ \int_{t_{E\gamma}}^{t_{E\gamma}-T} U_m dt - \int_{t_{E\gamma}}^{t_{E\gamma}-\tau\gamma} U_N dt \right] \stackrel{!}{=} 0$$

The latter are available at the end of each time divider period $T_y$ from $t_E$ to $t_{E+T}$ as the control deviation voltage signal $$\Delta U_{i\gamma} = \frac{1}{RC} \int_{t_{E\gamma}}^{t_{E\gamma}+T} U_D \, dt = \frac{T}{RC} \cdot \Delta U_D \qquad (5)$$

at the output of the amplifier $V_1$.

According to the embodiment shown, such a control deviation signal $\Delta U_i$ is subsequently converted in the control and counting unit SZ into a proportional digital value $m\gamma$ and the latter is utilized directly for correcting the divider ratio $$\alpha_\gamma = \frac{\tau_\gamma}{T} = \frac{n_\gamma}{N} \cdot \frac{T_c}{T_c} = \frac{n_\gamma}{N} \qquad (6)$$

from the past y time divider period to the divider ratio $$\alpha_{\gamma+1} = \alpha_\gamma + \Delta d_\gamma = \frac{n_\gamma + m_\gamma}{N} \qquad (7)$$

in the subsequent (y+1)th time divider period.

In the circuit according to FIG. 1, this is done particularly in that the integrator is integrated toward zero by switching off $S_2$ and depending on the sign of $U_{i\gamma}$ (ascertained by the comparator $V_2$) by logically closing $S_3$ and $S_4$, respectively. As is known from sawtooth encoders or also from the dual-slope method, the clock pulses $I_c$ from the clock generator CA counted into the counter Z during this integration over $S_5$, are utilized as the result of the integration.

The counting value $m\gamma$ is recognized by the control circuit SZ realized by the microprocessor $\mu P$ and is used for correcting the cycle time $$\tau_{\gamma+1} = \tau_\gamma + \Delta\tau_\gamma = (n_\gamma + m_\gamma) T_c \qquad (8)$$

in the $(\gamma+1)$th time divider period T, where $T_c$ represents the period of a clock pulse $I_c$.

With the correct design of $R_A$ and $U_k$ it is possible in this manner to slave the time divider ratio $\alpha_\gamma$ to any size of a squarewave step of the measurement voltage already in the following time divider period $\gamma+1$.

This behavior is also explained in detail, making reference to the diagrams in FIG. 2.

At the time $t=t_o$, the circuit shown is controlled to the steady-state balanced value $$\alpha_o = \frac{\tau_o}{T} = a_o = \frac{U_m}{Um_{max}} = \frac{G}{G_{max}} \qquad (9)$$

Thus, the definite integral of the voltage $U_D$ will furnish in the time from $t_o$ to $t_o+T$ exactly the value $\Delta U_{io}=O$. This integration takes place by applying the normal voltage $U_N$ by switching $S_1$ from $t_o$ to $t_o+\tau_o$ $U_m$ from $t_o$ to $t_o+T$ via $S_2$ to the first input of the integrator (operational amplifier $V_1$).

In a subsequent deviation encoding phase $AV_1$, in which the compensation voltage $-U_V$ is applied to the integrator $V_1$ at the time $t_2$ via $S_4$ and the resistor $R_A$, it is recognized because of $\Delta U_{io}=O$, that the counter value $m_1=o$ and therefore the first time divider cycle $\tau_1=\tau_o$ is to be retained.

At the time $t_1$, the measurement quantity and, coupled thereto, the input voltage $U_m$ execute a squarewave jump from $a_o$ to $a_1$. However, since $\tau_1=\tau_o$ still corresponds to the modulation factor $a_o$ prior to the squarewave jump, the control deviation signal $\Delta U_{il}$ will have a correspondingly large value at the time $t_4$ in the time divider period T following the time $t_2$.

In the subsequent deviation encoding phase $AV_2$ from $t_3$ to $t_4$, the compensation voltage $-U_k$ is applied via $S_4$ and $R_4$ to the integrator and $\Delta U_{il}$ is integrated down to zero in the time $t_{hl}=m_1 \times T_c$ and at the same time, $m_1$ clock pulses $I_c$ are counted into the counter Z.

During the time $t_{cl}$, $m_1$ is added to $n_1$ in the microprocessor $\mu P$, and so, the "on" time of the first time divider cycle $$\tau_2 = m_2 \times T_c = (n_1+m_1) T_c \qquad (10)$$

is prepared which sets in at the time $t_4$ with the start of the following time divider period T. The latter ends at the time $t_5$ and provides exactly the control deviation signal $\Delta U_{i2}=0$ provided the resistor $R_A$ and the compensation voltage $U_k$ are designed correctly. Therefore, also the counter value $m_2\equiv 0$ and a correction of $\tau_3$ relative to $\tau_2$ is not required.

If however, a sensitivity error should occur in a deviation encoding phase AV, for instance, by incorrect design of $R_A$, the mechanisms customary for any control loop become effective. While at the time $t_5$, a small residual voltage $\Delta U_{i2rest} \neq 0$ remains which however is completely broken down in the following time divider period, sensitivity errors in the control loop components, although they have reactions on the speed of the settling behavior, but not on the steady state balancing result of the overall circuit.

With the embodiment given, it is achieved in spite of its high settling speed, that the accuracy of the new circuit is determined exclusively by the reference normal (here, normal voltage $U_N$) and the divider accuracy (time divider cycle ratio $\alpha$) of the time divider and all analog components are therefore not critical.

FIG. 3 shows a second embodiment, expanded over FIG. 1, with a strain gauge strip pickup at a voltage supply $U_S$, the bridge circuit A of which can be compensated in the event of measuring quantity-dependent unbalances by an unbalance compensation resistor $R_v$ which is timed by $S_1$. Here, the resistor $R_v$ naturally forms the reference normal (see the normal voltage $U_N$ from FIG. 1) of the compensation circuit. The addition of the compensation quantity (see compensation voltage $+U_k, -U_k$ from FIG. 1) during the deviation encoding phase AV is carried out here by means of a voltage drop at compensation resistors $R_k$ and $R_N$ which are connected parallel to the voltage supply $U_S$.

As is shown by the diagrams in FIG. 4, the arrangement operates otherwise completely similarly to the basic circuit in FIG. 1; only the addition of the compensation quantity leads to somewhat changed down-integration processes during the deviation encoding phases AV.

From the third embodiment in FIG. 5, a further development can be seen which allows the down integration process to be cascaded. This is achieved through use of down-integration resistors $R_2$ and $R_3$ of different magnitude and allows to down-integrate control deviation voltages $\Delta U_{i\gamma}$ with a large slope until the comparator $V_2$, biased via resistors $R_4$, $R_5$ indicates that the correction values for the upper digital steps have roughly been reached. The remaining residual voltage $\Delta U_{i\gamma rest}$ can then be brought to zero finely via the very much larger down-integration resistor $R_3$ ($R_3 > R_2$) with less integration slope. The time $t_{2\gamma}$ required therefor serves for obtaining the value for the lower, fine digital steps.

The described cascading has the advantage that in spite of high resolution, only a very short down-integration time (typically less than 100 μs) is required for obtaining the digital correction values.

FIG. 6 shows a further embodiment according to FIG. 5, in which the pickup bridge circuit A is operated with ground symmetry, so that the integrator (operational amplifier $V_1$) provides additionally very great common-mode suppression. The resistors $R_1$, $R_2$, $R_3$ and switches $S_1$, $S_3$, $S_4$ according to the embodiment as per FIG. 5 are thus provided here for each input of operational amplifier $V_1$ ($R_{11}$, $R_{21}$, $R_{31}$; $R_{12}$, $R_{22}$, $R_{32}$; $S_{21}$, $S_{31}$, $S_{41}$; $S_{22}$, $S_{32}$, $S_{42}$).

The embodiment according to FIG. 7 includes some circuit variants known from German Pat. No. 33 30 841 which are advantageous if high suppression of noise components, thermal and contact voltage influences as well as null drifts of the operational amplifiers are expected. These are, for one, the cascading of the normal voltage with resistors $R_g$ and $R_f$ as unbalance compensation resistors and secondly, a clock pole reversal of the supply voltage via a polarity switch $S_{10}$. Furthermore, the additional use of an operational amplifier $V_o$, driven at only a very low level, with wiring by resistor $R_{v1}$, $R_{v2}$ is provided which makes possible a large common-mode suppression and potential separation in spite of a supply $U_S$ symmetrical to ground.

With this circuit it is advantageous that any phase-selective rectifications which may be problematic in view of conceivable semiconductor integrations, analog lowpasses and sign-selective voltage-frequency converters become unnecessary and their tasks can be taken over completely by digital electronics (microprocessor) which operate error-free, such as are available today already in single-chip technology in many embodiment versions.

The circuit variants according to FIG. 7, contains in addition an effective possibility to suppress possible null drifts of the operational amplifier $V_o$ which the latter recognizes from the different correction values as to magnitude and sign and which it obtains, for the same measuring quantities in successive time divider periods which, however, are supplied with polarity-reversed sign. Here, a capacitor $C_o$ can then be charged, depending on the sign, via switches $S_8$ and $S_{11}$, respectively, and a resistor $R_{oz}$ which capacitor conducts a drift compensation current $i_o$ to the operational amplifier $V_o$ via a resistor $R_{01}$.

Such stabilization of the operating point can be advantageous for integration purposes as well as for constructing very-high resolution analog-digital converters according to the principle presented.

From the signal diagrams of FIG. 8 which substantially agree with the above-described signal diagrams, it can be recognized in addition that it is possible to place the pole reversal of the supply voltage which has heretofore been critical as to time, into times at which no time divider integration takes place, without problem.

I claim:

1. A method for evaluating an analog electrical signal comprising the steps of:
   converting the analog signal to a digital signal with an analog-digital converter operating in accordance with the time divider principle and having a time divider period (T),
   said step of converting comprising first and second steps, the first step comprising forming an analog control deviation signal ($\Delta U_i$) corresponding to a mean deviation between an actual and a reference value of a time divider ratio ($\alpha_1$) during a first time divider timing period ($T_1$), and the second step comprising using the control deviation signal ($\Delta U_i$) for correcting a time divider timing ratio ($\alpha_2$) in a succeeding time divider timing period ($T_2$).

2. The method recited in claim 1, wherein the step of forming the analog control deviation signal comprises integrating by definite integration a measurement quantity ($U_m$) and a reference quantity ($U_n$) over the first time divider timing period ($T_1$).

3. The method recited in claim 1, further comprising converting the analog control deviation signal ($\Delta U_i$) into a digital control deviation signal (m) and wherein the time divider timing ratio ($\alpha_2$) of the succeeding time divider period ($T_2$) is equal to $$\alpha_2 = \frac{n_2}{N} = \frac{n_1 + m_1}{N}$$

where:
   $n_1$ represents a numerical value corresponding to a first time interval ($\tau_o$) of the first time divider period ($T_1$),
   $n_2$ represents a numerical value corresponding to a first time interval ($\tau_1$) of a succeeding time divider period ($T_2$),
   $m_1$ represents a numerical value of the control deviation signal ($\Delta U_i$) of the first time divider period ($T_1$), and
   N represents a numerical value corresponding to the length of the time divider period (T).

4. The method recited in claim 3, wherein
   the step of integrating by definite integration comprises integrating in the time divider period (T) by means of a Miller integrator with a rising ramp according to the dual-slope method, and the step of forming the digital control deviation signal (m) comprises counting down-integration of the analog control deviation signal ($\Delta U_i$) with the same Miller integrator with a downward ramp of the dual slope method during a deviation encoding period (AV).

5. The method recited in claim 4, wherein the down integration takes place in cascade.

6. Apparatus for evaluating an analog signal comprising:
   means for converting the analog signal to a digital signal with an analog-digital converter operating in accordance with the time divider principle and having a time divider period (T) and a time divider ration ($\alpha$),
   said means for converting comprising means for forming an analog control deviation signal ($\Delta U_i$) corresponding to a mean deviation between an actual and a reference value of a time divider ration ($\alpha_1$) during a first time divider timing period ($T_1$), and means using the control deviation signal ($\Delta U_i$) for correcting a time divider timing ratio ($\alpha_2$) in a succeeding time divider timing period ($T_2$), and further comprising:
   an integrating operational amplifier ($V_1$), having one measuring quantity (measuring voltage ($U_m$)) applied to one input via switches ($S_1$, $S_2$), controlled in the time divider ratio ($\alpha$) over the time divider period (T) and having a reference quantity (normal voltage ($U_N$)) applied via a switch ($S_1$ for one time interval of the time divider period ($\tau \leq T$), switches ($S_3$, $S_4$) for providing at one of the inputs of the operational amplifier ($V_1$) a compensation quantity ($-U_K$, $+U_K$) for down integration of the analog control deviation signal ($\Delta U_i$) present during a deviation encoding period (AV) at an output of the amplifier ($V_1$), a control and counting unit (SZ) for counting timing pulses during definite integration in the time divider period (T) and during down-integration, in the deviation encoding period (AV) and for operating the switches ($S_1$, $S_2$, $S_3$, $S_4$) to compute the measurement, reference and compensation quantities ($U_m$, $U_N$, $+U_K$, $-U_K$).

7. The apparatus recited in claim 6, wherein the control and counting unit (SZ) comprises a microprocessor ($\mu P$) receiving clock pulses ($I_c$) from a clock generator (CL) and coupled to a settable counter (Z) and a display unit (MA).

8. The apparatus recited in claim 6, wherein in succeeding time divider periods ($T_\gamma$ and $T_{\gamma+1}$) the integrating operational amplifier ($V_1$) is operated with reverse polarity and analog control deviation signals ($\Delta U_{i\gamma}$) obtained by definite integration or their corresponding digital values can be used also with a reverse sign for correcting the time divider ratio ($\alpha_{\gamma+1}$ and $\alpha_{\gamma+2}$, respectively).

9. The apparatus recited in claim 7, wherein the microprocessor ($\mu P$) contains a digital lowpass filter for digitally filtering out dynamic interference components, null drifts and noise components of the measurement values produced after each time divider period (T).

10. The apparatus recited in claim 8, further comprising
a measurement quantity pickup disposed in a bridge surface (A) for generating an electrical measuring quantity of ohmic sensor resistors and for providing an unbalance quantity by adding an unbalancing resistor ($R_V$) into a bridge arm, the measuring quantity pickup and the unbalancing resistor ($R_V$) being coupled by a polarity reversing switch to a d-c current or d-c voltage source ($U_S$), the control and counting unit (SZ) comprising means for controlling the polarity reversing switch ($S_{10}$) and the microprocessor comprising means for weighting the delivered deviation digital signals according to alternating polarity with synchronously changing sign.

11. The apparatus recited in claim 10, wherein the microprocessor comprises means for calculating the sign and the magnitude of a null drift from a comparison of a larger number of successive deviation correction values as a mean value and means for adding null drift compensation by providing same at the input of an integrating amplifier.

12. The apparatus recited in claim 11, wherein the sign and magnitude of a null drift are converted by a digital-analog converter into a digital signal for coupling to the input of the integrating amplifier for adding a null drift.

13. The apparatus recited in claim 6, further comprising an electromechanical scale, for generating the measurement quantity, in which an unbalance of strain gauge strips arranged in a bridge circuit (A) is generated by a weight load and means for deriving the weight to be displayed from the time divider ratio ($\alpha$).

* * * * *